United States Patent [19]

Koslar

[11] Patent Number: 4,527,118
[45] Date of Patent: Jul. 2, 1985

[54] TESTING DEVICE FOR INDICATING AN ELECTRIC VOLTAGE AND ITS POLARITY AND FOR CONTINUITY TESTING

[75] Inventor: Manfred Koslar, Rheda-Wiedenbrück, Fed. Rep. of Germany

[73] Assignee: Siemens Aktiengesellschaft, Berlin and Munich, Fed. Rep. of Germany

[21] Appl. No.: 392,801

[22] Filed: Jun. 28, 1982

[30] Foreign Application Priority Data

Jun. 29, 1981 [DE] Fed. Rep. of Germany ....... 3125552
Apr. 14, 1982 [DE] Fed. Rep. of Germany ....... 3213749

[51] Int. Cl.³ ............... G01R 13/02; G01R 19/14; G01R 15/12
[52] U.S. Cl. ............... 324/133; 324/73 R; 324/149
[58] Field of Search ............... 324/51, 133, 149, 115, 324/73 R, 96, 122

[56] References Cited

U.S. PATENT DOCUMENTS

| | | | |
|---|---|---|---|
| 3,425,649 | 1/1969 | Robinson | 324/133 X |
| 3,555,420 | 1/1971 | Schwartz | 324/149 |
| 4,015,201 | 3/1977 | Chafee | 324/96 X |
| 4,152,639 | 5/1979 | Chafee | 324/149 X |
| 4,210,862 | 7/1980 | Koslar | |
| 4,259,634 | 3/1981 | Okamoto | 324/96 |
| 4,301,407 | 11/1981 | Koslar | |
| 4,356,442 | 10/1982 | Beha | 324/149 X |

FOREIGN PATENT DOCUMENTS

| | | |
|---|---|---|
| 2734833 | 11/1979 | Fed. Rep. of Germany . |
| 3004734 | 10/1981 | Fed. Rep. of Germany . |
| 318368 | 4/1929 | United Kingdom ............... 324/133 |

*Primary Examiner*—Stanley T. Krawczewicz
*Assistant Examiner*—Jose M. Solis
*Attorney, Agent, or Firm*—Herbert L. Lerner; Laurence A. Greenberg

[57] ABSTRACT

Testing device for indicating electric voltage, polarity, and for continuity testing, including:
- two handles connected by a cable and having test prods;
- high-resistance series resistors connected to the prods;
- indicating stages having optical indicating elements with staggered voltage ranges in one handle;
- an oscillator connected to the indicating stages and to an acoustical signal generator;
- an isolation amplifier connected between the indicating stages and resistors;
- a battery connected to the amplifier and activatible by the amplifier;
- a switching power supply connected to the oscillator;
- an energy storage device connected to the amplifier;
- a first switch connected to the battery;
- a second switch connected between the power supply and the storage device for feeding voltage in a rest position, when the storage device is charged and being switchable into contact for feeding a charge to the amplifier and for checking operability in sequence;
- transistors having bases connected to the oscillator for intermittently switching on indicating current for optical elements for a brief time for higher voltages and for optical elements for lower voltages;
- a Zener diode connected between one resistor and the first switch; the first switch being switchable to rest position for shorting the diode and into contact for switching on the battery, for continuity testing through a conductor between the prods and internal testing for direct contact between the prods for the battery, the signal generator, an optical element for polarity, another optical element for battery voltage and charging of the storage device.

9 Claims, 7 Drawing Figures

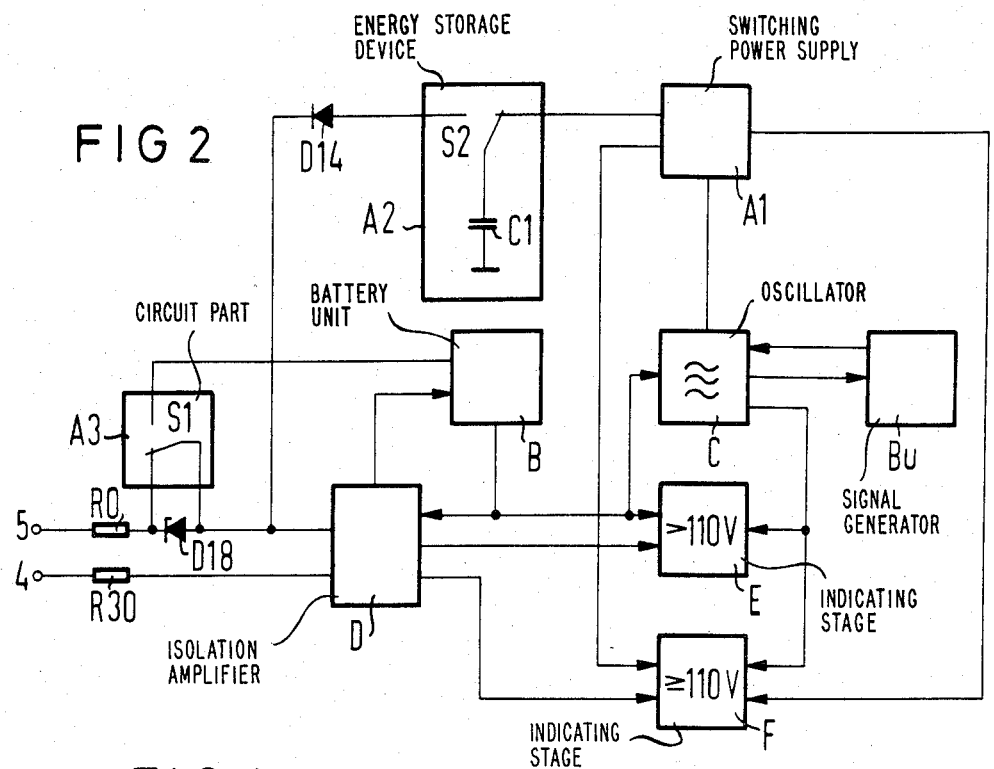
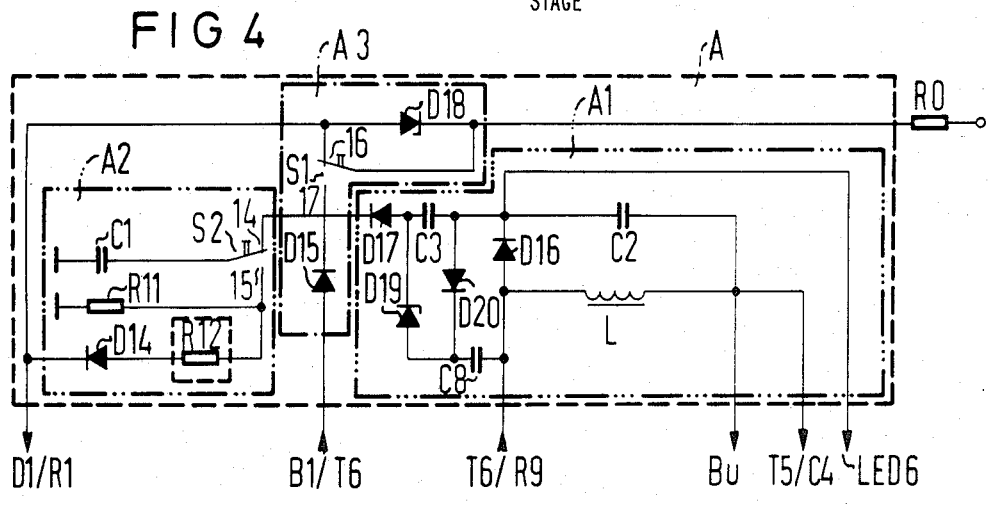
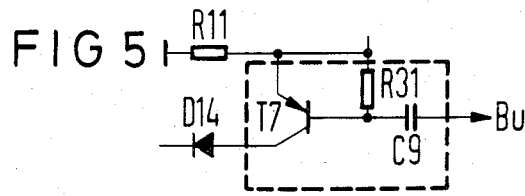

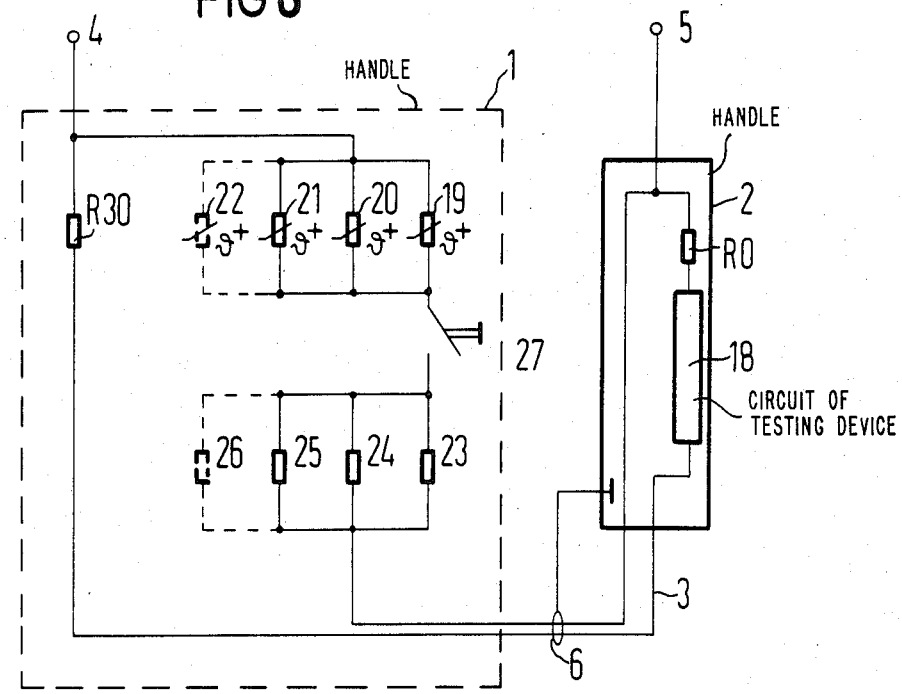
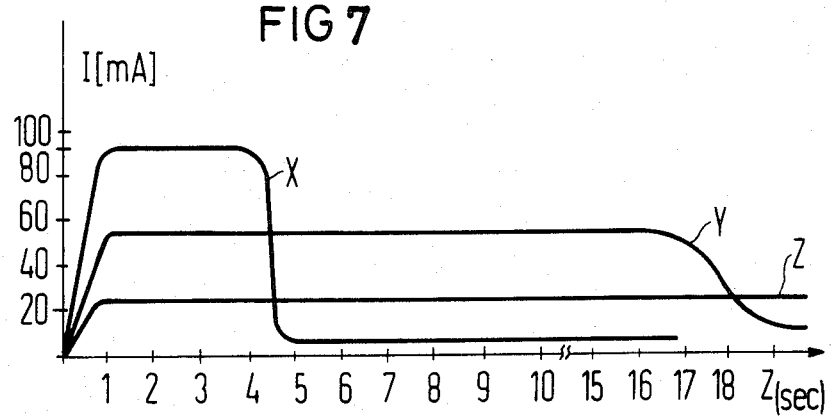

TESTING DEVICE FOR INDICATING AN ELECTRIC VOLTAGE AND ITS POLARITY AND FOR CONTINUITY TESTING

The invention relates to a testing device for indicating an electric voltage, for indicating its polarity and for continuity testing, which includes two handles that are connected by a cable, are provided with test prods and each contain a high-resistance resistor connected in series with the test prods, and one of these handles contains optical indicating elements of indicating ranges staggered in voltage ranges (for instance 6, 12, 24, 50, 110, 220, 380 and 660 V), an oscillator which can drive an acoustic signal generator if provided, and an isolating amplifier which amplifies the input current that is limited by the two series resistors, switches the battery provided in the testing device into the circuit and thereby brings about the staggered indication of the voltage to be tested, optionally brings about the indication of the polarity, and switches on the acoustic signal generator.

A testing device which has these features is commercially available under the designation "Weidmüller U1T" and is described in the catalog of the firm Weidmüller which has the designation "U1T Safety×7". This catalog was distributed for the first time at the Hanover Exposition in 1980 free of charge (see also the journal "ETZ", volume 102 (1981), Number 14, Page 747).

The known testing device indicates voltages to be tested in the above-mentioned voltage ranges and are staggered, but without 660 volts. The series resistors which are provided in the two handles and are connected in series with the test prods each have a resistance of 5 megohms, i.e., 10 megohms together. The testing current of the voltage to be indicated and the indicating current are separated from each other by an isolation amplifier, which receives the current generated by the voltage to be tested and limited by the two series resistors. The indicating current which feeds the respective indicating stages is supplied by the battery (12 V) and is switched on by transistors provided in the isolation amplifier section.

The known testing device contains a signal generator which is described in co-pending U.S. application Ser. No. 329,272, filed Dec. 8, 1981. The signal generator (buzzer) is in the form of a piezo-ceramic disc with three electrodes. The control voltage is applied to the exciter electrodes, and the generated signal is acoustically coupled out at the third electrode (feedback electrode) and fed through a resistor to the input of an amplifier. An electroacoustically fed-back audio signal generator is therefore involved, the fundamental frequency of which is determined by the oscillation parameters of the piezo-electric ceramic disc. A coil connected to the signal generator serves for increasing the voltage to raise the volume.

In the known testing device, the individual indicating stages are subdivided three ways. The indicating stages which indicate a test voltage of from 6 volts to less than 12 volts simultaneously serve for indicating the polarity in the case of d-c voltage. If an a-c voltage is applied, the light-emitting diode for negative polarity as well as the light-emitting diode for positive polarity light up.

The indicating stages for voltage ranges of from 12 V to less than 24 V; 24 V to less than 50 V and 50 V to less than 110 V represent an indicating chain if connected together, while the indicating stages for voltage range from 110 V to less than 220 V; 220 V to less than 380 V and equal to or larger than 380 V connected together likewise represent an indicating chain.

Within these indicating chains, voltage dividers, transistors and light-emitting diodes are wired together in the manner which is described in German Published Prosecuted Application DE-AS No. 28 46 675, corresponding to U.S. Pat. No. 4,301,407 and European Pat No. 00 11 711. The individual taps of the measuring divider including resistors are respectively connected to the base of the transistor assigned to each indicating stage, while the emitters of these transistors are connected through the nonlinear indicating elements provided as light-emitting diodes, in such a way that the transistors, staggered among themselves, always act as nonlinearly operating differential amplifiers, in that the emitters of two respectively succeeding transistors are connected through the indicating element, and the collectors are connected to each other and lead to a common voltage supply.

The known testing device has a key which may be placed in a rest position so that the testing device serves for testing voltage. If this key is switched, the battery which is accomodated in a housing according to German Pat. DE-PS No. 27 56 830 (see also U.S. Pat. No 4,210,862, FIGS. 7 and 8) is switched on, so that a conductor disposed between the test prods can be checked for continuity. If the two test prods make direct contact with each other, the functions of the testing device namely the operational readiness of the battery and its voltage (it should be 12 V), of the signal generator and the indicating elements for the polarity indication, are checked. Further built-in tests are not possible with the known testing device.

A testing device of the type indicated at the outset herein, i.e. a two-pole testing device with high input resistance, must meet several requirements, primarily for reasons of safety for the operator using the testing device, but also for reasons of unambiguous indication and practical handling; these are described in the following points:

1. The internal resistance of the testing device must be at least high enough (higher than 500 kOhm) so that the testing operator is still sufficiently protected even upon contact with a test prod; testing devices with a resistance of 500 kOhm and more have the advantage that with an a-c voltage of 220 V to ground, a test prod can be touched without danger to a person, if the other contact prod is under voltage (shock protection);

2. the series resistors which bring about the high input resistance reduce the testing current but an unambiguously bright indication for the presence of a voltage should take place nevertheless; the high input resistance of such a testing device ensures that no substantial measurement falsification occurs in the case of high-resistance voltage sources, and it ensures shock protection in addition, as indicated under Point 1;

3. the high input resistance of the testing device requires that a separate voltage source be provided for the indicating elements, i.e. that the testing current and the indicating current must be separate from each other;

4. the high input resistance, optionally together with peak voltage resistant resistors, ensures that if voltage peaks occur in the network, no breakdown and therefore no destruction of the voltage tester causing danger for the testing person are possible (peak voltage strength);

5. high-resistance series resistors which are provided in the handle containing the indicating elements as well as in the other handle of the 2-pole testing device, are to ensure that even in the event of damage to the cable connecting the two handles, such as by accidental cutting or chafing through of the cable, the safety of the testing person is assured (separation of the input resistance into two series resistors);

6. the testing device should have an optical as well as an acoustical indication in order to prevent incorrect conclusions with double safety; for this reason the optical indication should be sufficiently bright and the acoustical indication should be sufficiently loud;

7. the testing device should be safe in the face of any conceivable incorrect operation; such incorrect operation is present if according to the requirement of Point 1, one of the test prods is at a high voltage and the other test prod is touched by the testing personnel: for this type of incorrect operation, the testing device is constructed with high resistance. Furthermore, incorrect operation may occur if the switch for the continuity test or built-in test is operated while high voltage is present at the contact prods (for instance, line voltage); in such a case there must not only be no danger for the equipment and the user but in addition, the terminal voltage present must be indicated unambiguously;

8. it should be possible to test a battery-operated testing device for operability of the battery and it should contain a built-in battery tester for this purpose;

9. in addition to this built-in battery tester, a testing device of the type discussed herein must ensure a continuity test from prod to prod, where the indicating elements for the polarity test and for the lower voltage ranges are checked for indicating the battery voltage;

10. the testing device must switch itself on so that an incorrect interpretation of an indication which could occur if the user himself must switch on, is possible;

11. a complete functional test should make it possible to unambiguously check the proper operation of each individual indicating stage before or during the voltage test;

12. it must be assured that the functional test allows not only the checking of the indicating functions (optical step indication and acoustical indication), but that the cable which connects both test handles, the second test handle, and the test prods, are also checked for proper operation, and that the functional test can be recognized without doubt as being complete only if both conditions are fulfilled;

13. above the voltage range for 380 V, a further voltage range (for instance 660 V) should be indicated (so as to be able to work in outside networks, such as on board ships);

14. the testing device should also make it possible to lower the high input resistance (more than 600 kOhm) temporarily.

From British Pat. GB-PS No. 1 562 578 or U.S. Pat. No. 4,210,862, both of which correspond to several German priority applications, with respect to which the priority application on which German Pat. DE-PS No. 27 34 833 is based is relevant, it is known, in a low input resistance testing device for voltage and continuity tests, to shunt the key which allows a voltage test in its rest position and continuity tests in the operating position, by a Zener diode, which in the present context would meet that part of the requirement of Point 7 of the above-mentioned list of requirements which is concerned with incorrect operation of the key with terminal voltage present.

Some of these requirements (1, 2, 3, 4, 8, 9, 10) are also met by a testing device in the form of a screw driver which is described in German Published, Non-Prosecuted Application DE-OS No. 30 04 734; however, this testing device is a single pole device, is not suited for a staggered indication and is not suited for meeting other requirements.

The testing device which was described in detail above and is part of the state of the art only meets the requirements of Points 1 to 10 of the requirement list. Adding a further indication stage for a still higher voltage range (requirement of Point 13) is not possible under the conditions present in this known testing device, and the known testing device is not suited for meeting the requirements of Points 11, 12 and 14.

It is accordingly an object of the invention to provide a testing device for indicating an electric voltage and its polarity and for continuity testing, which overcomes the hereinafore-mentioned disadvantages of the heretofore-known devices of this general type, and to do so in such a manner that all of the requirements of the requirement list are met.

With the foregoing and other objects in view there is provided, in accordance with the invention, a testing device for indicating an electric voltage and its polarity and for continuity testing, comprising:

a first and a second handle for accomodating circuits therein, a cable connected between the handles, first and second test prods each being respectively connected to one of the handles;

two high-resistance series resistors being connected in series with the test prods;

indicating stages having optical indicating elements with staggered voltage ranges disposed in one of the handles;

an oscillator connected to the indicating stages;

an acoustical signal generator being connected to and selectively drivable by the oscillator;

an isolation amplifier connected between the indicating stages and the high-resistance series resistors for amplifying input current being limited by the high-resistance series resistors;

a battery being connected to the isolation amplifier and being connectible into the testing device by the isolation amplifier to bring about a staggered indication of voltage to be tested, to selectively indicate polarity of the voltage to be tested and to switch on the acoustical signal generator;

a switching power supply being connected to and fed by the oscillator for increasing voltage of the oscillator limited by the battery;

an energy storage device such as a capacitor connected to an input of the isolation amplifier for storing a charge and delivering it to the isolation amplifier;

a first switching element connected to the battery;

a second switching element being connected between the switching power supply and the energy storage device for feeding output voltage of the switching power supply to the energy storage device when the second switching element is in a set position, the second switching element being in the rest position when the energy storage device is being charged and being switchable into a contact position for feeding a charge contained in the energy storage device to the input of the isolation amplifier and for automatically checking operability of all indicating functions of the testing device in sequence;

transistors having bases connected to the oscillator for intermittently switching on or chopping indicating current for a first group of the optical indicating elements for a given relatively brief time for voltages to be tested in given relatively higher voltage ranges and for a second group of the optical indicating elements for voltages to be tested in given relatively lower voltage ranges; a Zener diode connected between one of the high-resistance series resistors connected to the second test prod and the first switching element connected to the battery;

the first switching element being switchable into a rest position for shorting the Zener diode and into a contact position for switching on the battery, in the contact position of the first switching element the continuity test being performed through a conductor inserted between the test prods or an internal test being performed if direct contact is made between the test prods for operability of the battery, the acoustical signal generator, at least one of the optical indicating elements for the polarity indication, and at least one other of the optical indicating elements depending on voltage of the battery and charging of the energy storage device.

In accordance with another feature of the invention, the isolation amplifier serves as an input stage and the two high-resistance voltage-proof series resistors are connected in series with the isolation amplifier, one of the series resistors being disposed in the first handle and the other of the series resistors being disposed in the second handle, the series resistors being connected together by the cable and the series resistors limiting current generated by voltage to be tested and fed to the isolation amplifier, and including a shield disposed on the cable;

the isolation amplifier including emitter follower transistors, input dividers connected to the emitter follower transistors, Zener diodes connected to the emitter follower transistors forming a bridge rectifier for causing the emitter follower transistors to conduct depending upon the connection of the polarity of the voltage to be tested through the bridge rectifier, additional transistors connected to the emitter follower transistors, two of the optical indicating elements being in the form of a light-emitting diode for indicating a positive input voltage and a light-emitting diode for indicating a negative input voltage both being connected to the additional transistors, and a further transistor being connected to the emitter follower transistors and having a base connected to the battery, one of the light-emitting diodes, and both of the light-emitting diodes in the case of an a-c voltage, being driven and simultaneously caused to conduct depending on the polarity of the voltage to be tested through the additional transistors, the base of the further transistor being given a potential difference relative to the positive potential of the battery and current for lighting the light-emitting diodes switched on by the further transistor being caused to flow by having the additional transistors in conduction;

the oscillator including an oscillator transistor, oscillator resistors connected to the oscillator transistor, and an inductor connected to the oscillator transistor and to the acoustical signal generator, the acoustical signal generator being constructed in a known manner in the form of a piezo-ceramic oscillator having three electrodes and being switched on by the oscillator transistor through the oscillator resistors;

the switching power supply being driven by the oscillator and including four power supply diodes connected to each other, three coupling capacitors connected to the power supply diodes, and the inductor;

the energy storage device including a storage capacitor, one of the power supply diodes for peak rectification, and the second switching element being connected between the storage capacitor and the one power supply diode for peak rectification in the rest position of the second switching element, voltage pulses from the switching power supply being stored in the storage capacitor by the one power supply diode for peak rectification for charging the storage capacitor to the peak value of the voltage pulses; and a protective diode and a current limiting resistor being connected between the contact of the second switching element and the input of the isolation amplifier.

In accordance with a further feature of the invention, the indicating stages for the staggered indication of individual voltage ranges are in the form of two indicating chains or stages being separately supplied with indicating current, one of the indicating chains for the lower voltage ranges being supplied from the battery through the further switching transistor, the other of the indicating chains for higher voltage ranges being supplied by the switching power supply, and both of the indicating chains being intermittently switched on or chopped for saving current with the frequency of the oscillator.

In accordance with an added feature of the invention, the current limiting resistor between the contact of the second switching element and the protective diode is replaced by a circuit including a resistor, an isolation transistor and a coupling capacitor, the transistor having a collector terminal and an emitter terminal, one of said terminals being connected to the protective diode and the other of said terminals being connected to one terminal of the current limiting resistor and to the contact of the second switching element, and a base connected to the other terminal of the current limiting resistor, and a coupling capacitor having a pole connected to the base of the isolation transistor and to the other terminal of the current limiting resistor.

Besides all of the advantages obtained with the known testing device, the testing device of the present invention also achieves the result of being able to indicate a further voltage range above 380 V (660 V should be mentioned here as customary and occuring in industry). A special advantage is met in the testing device of the present invention, which is the requirements (Points 11 and 12) of the requirement list that all indicating stages of the staggered voltage range indication can be checked with the additional functional test and specifically as far as the internal battery test is concerned as well as during the voltage test. Therefore, if after all indicating stages have been checked, a defect occurs in the functional test in the testing device or at least in one indicating stage, this effect can still be detected during the voltage test. As an example, it will be mentioned that a tester may determine with the testing device that a voltage source has 220 V, because all indicating elements for this voltage light up but not the indicating elements for 380 or 660 V. In order to be sure that 380 or 660 V are not present just the same, the tester can operate the second switching element, so that the energy storage device is discharged and the indicating elements of the indicating stages for the voltage ranges 660 V and 380 V amplified through the isolation amplifier must also light up. If subsequently one of the two indicating elements of the upper voltage ranges does not light up, then the corresponding indicating stage is defective. If both indicating elements do not light up, then both indicating stages are defective. If, however, both indicating elements light up and are extinguished again in accordance with the discharge of the energy storage device, the testing person can be sure that the applied voltage is indicated correctly.

With this additional fruntional test, the testing device can be given to a layman active in this area without difficulty' because all conceivable operating errors and all conceivable misinterpretations of the indication have been precluded.

Through the use of the testing device according to the invention, it should further be possible to distinguish in a voltage test whether the voltage source is low-resistance or high-resistance. For measurement reasons and also for reasons which concern safety, testing devices must have a relatively high input resistance, as with voltage measuring devices in general.

The high input resistance, which is preferably approximately in the order of magnitude of one MOhm, such as equal to or larger than 600 kOhm, is necessary so as not to overly falsify voltage sources with a high internal resistance and to ensure, for safety reasons, sufficiently high dielectric strength in the case of surge voltages of the testing devices under discussion herein.

With an input resistance of approximately 600 or 660 kOhm, for instance, the input current is for

| 110 | 220 | 380 | 660 | $(V_{rms})$ |
|---|---|---|---|---|
| 0.17 | 0.33 | 0.58 | 1 | $(mA_{rms})$. |

The input current is therefore not dangerous even if critical scales are applied, if the user inadvertently touches one of the test prods while the other test prod is connected to a high voltage.

On the other hand, the testing devices under discussion here are used also for testing devices such as switchboards or for testing the wiring of large installations. This leads to difficulties in practice because these testing devices are too sensitive because of the high input resistance and because external voltages of unconnected or unswitched cables (idling lines) are indicated by the testing device.

To use the device for the purpose given, it is necessary to use so-called low resistance voltage testing devices. System-wise, however, this leads to the requirement that voltage testing devices, while needing high resistance, (for measurement reasons and safety reasons), must have a so-called load resistance addable for reducing the input resistance, if desired.

The present invention therefore also is concerned with this problem and has the further objective of describing a circuit arrangement for lowering the input resistance of a testing device as described in the introduction. In such a circuit it should be possible to limit the ohmic load timewise, and specifically in such a way that it is switched off without any action on the part of the user if a certain amount of energy is exceeded. However, the time must be made long enough so that the user is also given the possibility of understanding the load test and its effect on the test result.

For solving this problem, in accordance with an additional feature of the invention, there is provided a circuit for temporarily lowering a high input resistance, having at least one PTC resistor shunted across the circuit accommodated in the second handle and across the two high-resistance series resistors forming the high input resistance, the at least one PTC resistor having a normal resistance between 200Ω and 5 kΩ for ensuring a time constant of internal heating (operation switching time $t_{aB}$) of at least one second.

In accordance with again another feature of the invention, there is provided at least one other resistor each having substantially fixed resistance values and being individually connected in series with each of the at least one PTC resistor.

In accordance with again a further feature of the invention, the input resistance of the two high-resistance series resistors is substantially equal to 660 kΩ and the at least one PTC resistor has a nominal resistance value of substantially between 200Ω and 5 kΩ.

In accordance with a concomitant feature of the invention, the at least one other resistor has a resistance value of substantially between 1 kΩ and 15 kΩ.

This solves the problem of allowing voltage testing devices with a high input resistance to be shunted as desired, for instance a key, and by a resistor approximately in the range of 2 to 10 kOhm connected in parallel.

Due to a power consideration, the problem leads to a certain contradiction, since if for instance the highest voltage indicated in the voltage testing device is 500 V, the addition of a resistor of 4 kOhm in the voltage testing device would release a power of 63 W. The temperature rise of the testing device caused thereby, i.e. of the handle in which the circuit is contained, would be unavoidable, so that this approach does not represent a solution to the problem.

This large load could be provided, for instance, by reactive impedances, provided by connecting coils or capaciotors into the circuit. According to VDE regulations, however, the use of reactances is not permissible for safety reasons. Introducing purely ohmic resistors would not have resolved the contradiction indicated.

By using a PTC resistor proposed herein which automatically changes its resistance toward higher values according to its internal temperature rise after a given time, so as to regulate the current back again and to thereby limit the power, it became possible to solve the problem underlying the invention and to eliminate the resulting contradictions in the statement of the problem.

With respect to the definition of PTC resistors, reference is made to the German standard DIN No. 44 080, December 1976. In this specification it is defined in detail what a PTC resistor is understood to be and how the individual statements of the properties, such as a nominal resistance $R_N$, and the operating switching-off time $t_{aB}$ are defined.

In order to influence the time constant of the heating process, it is advantageous to connect a normal ohmic resistor in series with the PCT resistor, such as a resistor with practically fixed resistance. This causes the power at the corresponding series resistor to be divided up at the moment of switching on in such a manner that it takes a certain amount of time until the PTC resistor is heated up to the extent that it becomes of high resistance and thereby regulates the current back.

The time constant of the heating process can be influenced by the volume of the PTC resistor. Such a PTC resistor must be relatively large and would have a thickness of 20 mm with a diameter of 10 mm.

The commercially available PTC resistors which are distinguished by their small volume (for instance, a diameter of 5 mm and thickness of 1 mm) are substantially less expensive and more accurate as far as the constancy of their values are concerned, but such PCT resistors would become of high resistance too fast (in a few milliseconds), so that the user has no time left to read an unambiguous result of the test to the effect as to whether the voltage source has a high or low internal resistance. By using the resistance with a practically fixed resistance value (series resistance) connected in series with the PTC resistance, it is possible, according to an advantageous further embodiment of the invention, to influence the time constant of the heating process so that the user has several seconds left to read the test result.

A further reduction of the load resistor which results from the PTC resistor alone or a PTC resistor connected in series with a series resistor, can be achieved according to a further embodiment of the invention by connecting such systems in parallel, which themselves include a series circuit of a PTC resistor with a normal resistor.

In one preferred embodiment of the invention at least one PTC resistor can be added, if desired, assuming an input resistance of the testing device of about 600 or 660 kOhm, which results in a nominal resistance value $R_N$ of 1.5 kOhm. In this case it is advantageous that the at least one fixed resistor connected in series with a PTC resistor gives a resistance of 12 kOhm.

Other features which are considered as characteristic for the invention are set forth in the apnended claims.

Although the invention is illustrated and described herein as embodied in a testing device for indicating an electric voltage and its polarity and for continuity testing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a schematic and block circuit diagram illustrating the principle of operation of the testing device;

FIG. 4 is a circuit diagram of a portion of the circuit according to FIG. 3;

FIG. 5 is a detailed circuit diagram for the circuit of FIG. 4;

FIG. 6 is a diagrammatic and schematic circuit diagram for the temporary lowering of the input resistance; and FIG. 7 is a graph showing the load current as a function of the applied voltage with temporarily lowered input resistance.

Figure 1:
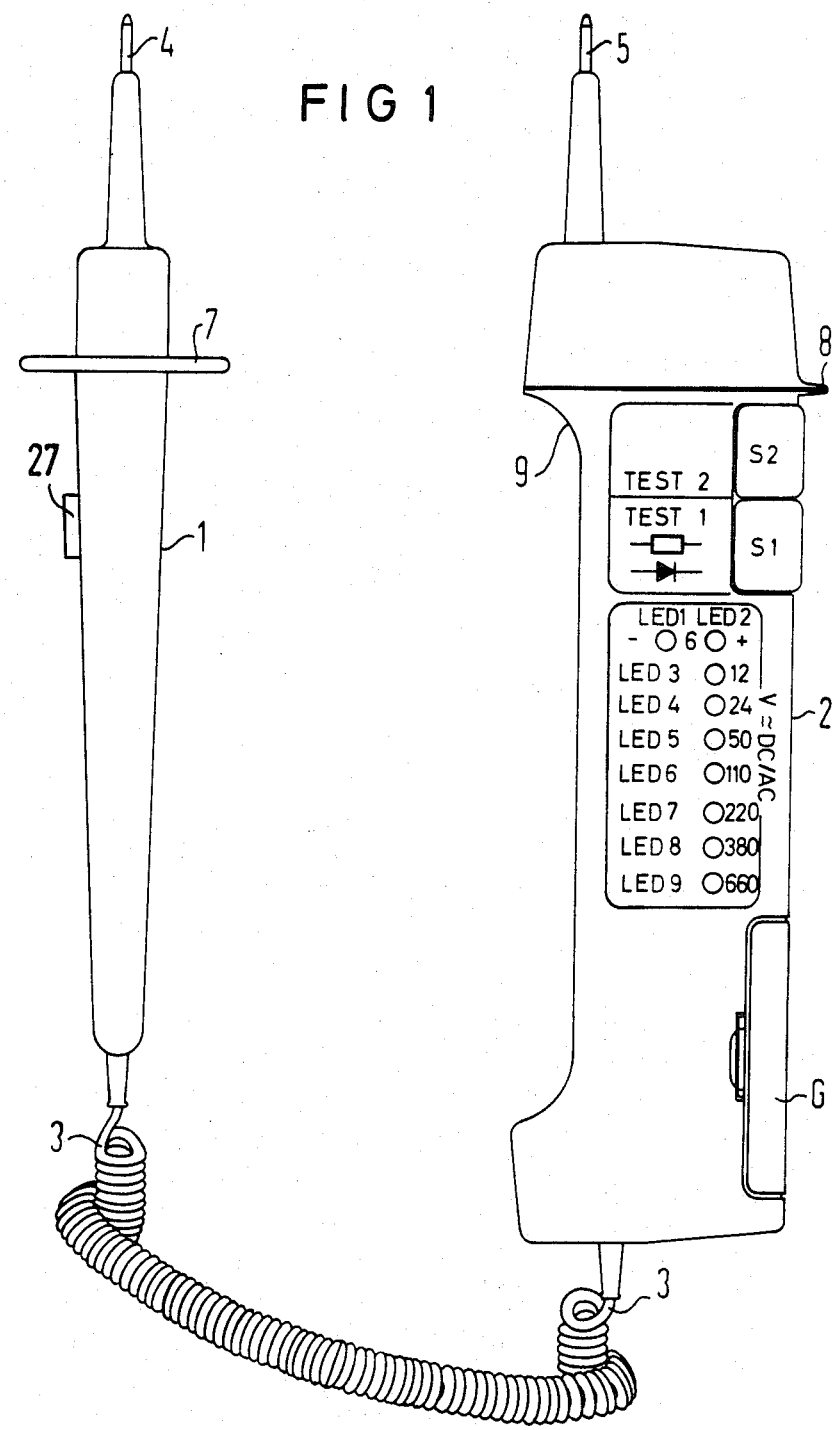
FIG. 1 is a diagrammatic overall top-plan view of the testing device of the invention, approximately on the scale 1:1.
Figure 3:
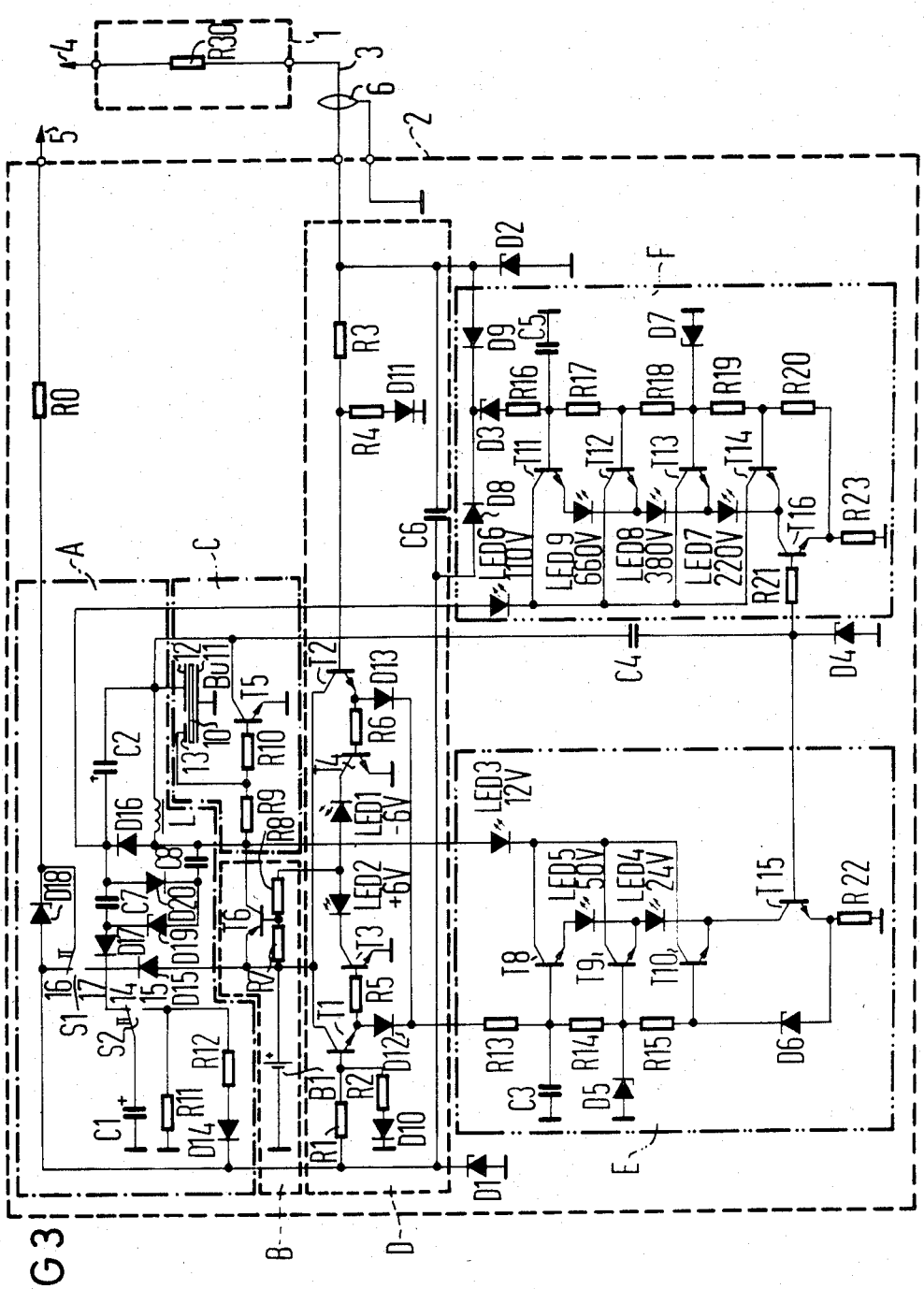
FIG. 3 is a schematic circuit diagram of the overall circuit of a preferred embodiment of the testing device.

Referring now to the figures of the drawings in which like or corresponding parts are provided with the same reference symbols, and first particularly to FIG. 1 thereof, there is seen a handle 1 which is connected to a handle 2 by a cable 3. The handle 1 is provided with a test prod 4 and the handle 2 is provided with a test proc 5. In FIG. 3, the handles 1 and 2 are shown by area: framed in dotted lines. The cable 3 is equipped with shielding 6.

While the handle 1 only carries the test prod 4 anc only contains in its interior a high-resistance, high-dielectric strength series resistor R30 connected in serie: with the test prod 4, it is referred to herein as the tesi handle 1. The resistor R30 may have a resistance value of 330 kΩ, but this is merely one possibility. Possible values for the components of the circuits will be giver in parenthesis, but it should be understood that these are representative only. The handle 2 equipped with the test prod 5 contains in its interior the entire circuit 1ξ shown in FIG. 6 and is equipped with indicating elements LED1 to LED9 (for 6, 6, 12, 24, 50, 110, 220, 38C and 660 V, respectively, Siemens model CQV 10-5/LD 30 II) and two keys of switches S1 and S2. This handle is referred to herein as the indicator handle 2. In addition, the indicator handle 2 contains a housing G ir which a battery B1 (12 V) is contained. The housing G is described in German Pat. DE-PS No. 27 56 830 (see also U.S. Pat. No. 4,210,862 corresponding to British Patent GB-PS No. 1,562,578).

The test handle 1 as well as the indicator handle 2 are provided with antislip rings 7 and 8 in accordance with the pertinent regulations for such testing equipment These antislip rings are to prevent the users of the testing device from coming into contact with the terminal: of the voltage source. A depression 9 in the indicating handle 2 permits the handle to be gripped firmly anc safely by the user.

The keys of the switching elements S1 and S2 are disposed in such a way that they can be operated by the thumb when the indicator handle 2 is gripped by the right hand; at the same time, the indicator element: LED1 to LED9 are disposed on the surface of the indicator handle 2 in such a manner that they are not covered up by fingers or by the ball of the thumb.

The indicator handle 2 is shown in FIG. 1 in a top view on its broad side. The indicator handle 2 is relatively flat, i.e. its thickness is only about one third of its width.

The handle 1 can not only be constructed as a round bar(as seen in FIG. 1), but the handle 1 may also have the same external shape as the handle 2, particularly i the components according to the circuit as per FIG. ( are accomodated in the handle 1.

In the block diagram according to FIG. 2, it is shown that the test prods 4 and 5, forming the input, are connected through high-resistance series resistors R30 anc R 0 (330 kΩ), respectively to an isolation amplifier D The polarity indication is integrated with the isolation amplifier, which simultaneously represents the indicating stages for the lowest voltage range.

The current which is reduced by the high-resistance series resistors R30 and R 0 and which is generated by the voltage source to be tested, is amplified in the isolation amplifier and as a result, the indicating curren which is required for supplying the individual indicat ing stages and which is supplied by the battery B1, i: switched on, i.e. the battery unit B which is providec with the switching-on mechanism is addressed. Further more, individual indicating stages E and F and an oscil lator C are addressed. The oscillator C is optionally connected to an acoustical signal generator (buzzer) Bu The oscillator C supplies a switching power supply A: which serves for increasing the voltage. The switching power supply A1 feeds an energy storage device A2 as long as an interposed switching element S2 is in the rest position as is shown in FIG. 2.

If the switching element S2 which is in the rest position during the charging of the energy storage device A2, is switched, then the charge contained in the energy storage device A2 is applied through a series resistor R12 (5.6 kΩ) and a diode D14 (IN 4148) to the input of the isolating amplifier D. At the beginning of the discharge, this voltage simulates a voltage applied to the test prods 4 and 5, which is higher than the highest voltage that can be indicated by the testing device, so that according to the discharge of a capacitor C1 (22μF/50 V), all indicating stages are addressed, and therefore all indicating elements light up and are extinguished one after the other.

The circuit part A3, which contains a switching element S1, shown in the rest position, and which has a Zener diode D18 (24 V) associated therewith, serves for switching on the battery and accordingly for switching the testing device to continuity testing if there is a medium between the test prods 4 and 5, which is to be tested for conduction. If the test prods 4 and 5 are shorted directly, internal tests are performed of the testing device for operability of the battery, the signal generator Bu, the indicating elements for the polarity indication, and, depending on the battery voltage, one indicating element of an indicating chain or stage E belonging thereto. Through the isolation amplifier and the entire cycle of the switching operation, the energy storage device A2 is also charged up in the process so that when the switching element S1 is switched from the working position to the rest position and switching of the switching element S2 from the rest position to the operating position is carried out, the operability of all indicating stages takes place in accordance with the discharge of the capacitor C1. It is important for the cycle of the complete functional test which is functionally absolutely required that the complete test include two steps. According to the hereinafore-described requirement list, the functional test is unambiguous if and only if not only is it that the simulated test voltage is applied to the input isolation amplifier, but that this test 2 can be performed only under the condition that all connecting elements (prods, series resistors, cables and input stages) operate properly. However, since the switching on and thus the charging of the capacitor C1 can be performed only by the test 1 (prod-to-prod continuity test) or through an external voltage which is present at the test prods externally, it is guaranteed that test 2 can be performed only if all connecting elements work (points 11 and 12 of the requirement list).

The overall circuit diagram of a preferred embodiment of the testing device of the present invention is subdivided according to FIG. 3 into several main parts A to F.

The subcircuit A is again subdivided, according to FIG. 4, into three subcircuits A1, A2 and A3.

In FIG. 3, the test handle 1 and likewise the indicating handle 2, are represented by a field framed by dotted lines. The handles are connected to each other by the cable 3 provided with the shield 6.

Besides the test prods 4 and 5, the two high-resistance series resistors R30 in the test handle 1 and R 0 in the indicating handle 2 belong to the input stage.

The current generated by the voltage to be tested is limited by the high-resistance series resistors R30 and R 0 and fed to the isolation amplifier D. This isolation amplifier D contains transistors T1 and T2 (both BC 237) which are connected as emitter followers. The current limited by the high-resistance series resistors R30 and R 0 is fed to these emitter followers through input divider resistors R1 (100 kΩ) and R2 (180 kΩ), and R3 (100 kΩ) and R4 (180 kΩ), respectively, that the transistor T1 or T2 becomes conducting depending on the polarity of the test voltage, through a bridge rectifier which is formed by the transistors T1 and T2 and the Zener diodes D1 and D2 (both 51 V).

Depending on the polarity present, the light-emitting diode LED2 is addressed and becomes conducting through transistors T3 and T4 (both BC 237), respectively, for +6 V, or the light-emitting diode LED 1, for −6 V; the battery B1 is simultaneously switched on because the base of a switching on transistor T6 (BC 556) of the battery unit B is given a potential difference against the positive potential of the battery B1 because the transistor T3 or T4 becomes conducting, and the current for lighting up the light-emitting diodes LED1 and/or LED 2 can flow from the battery B1, switched on by the switching on transistor T6. In series connection with the base of the switching on transistor T6, is a resistor R7 (100 kΩ) connected vis-a-vis the battery B1, and a resistor R8 (3.9 kΩ) connected vis-a-vis the light emitting diodes LED 2 and LED 1, respectively.

Resistors R5 and R6 (both 47 kΩ) are also connected in series with the bases of the transistors T3 and T4.

An oscillator transistor T5 (BC 546) which is controlled by the isolation amplifier and is simultaneously switched through resistors R9 (150 kΩ) and R10 (15 kΩ) with switching into conduction of the transistors T3 and/or T4 and the energy stored in an inductance L (100 mH), of the switching power supply A1 by the switching on process, is shorted to ground.

A piezo-ceramic flexure oscillation disc 10 of the acoustical signal generator Bu (buzzer) is deflected through exciter electrodes 11 and 12 by the voltage pulse. Due to the springback of the piezoceramic flexure oscillator disc 10, the base of the oscillator transistor T5 is again blocked by an acoustical feedback electrode 13.

The oscillator C works nonlinearly with the active quadrupole (transistor T5) on the electrodes 11 and 12 of the piezo-ceramic flexure vibrator 10, and through electroacoustic feedback, the oscillator C is operated with the resonant frequency of the piezoceramic flexure vibrator 10 with positive feedback, while the inductance L serves as the energy storage device.

A signal generator of the type described herein is the subject of co-pending U.S. application Ser. No. 329,272, filed Dec. 8, 1981. If an input voltage is present at the test prods 4 and 5 in the range between 6 V and less than 12 V, the diodes LED1 and LED2 which indicate the polarity, and accordingly the battery B1 and furthermore the acoustical signal generator Bu, are switched on.

For smaller input voltages, diodes D10 and D11 (both IN 4148) cause a reduction of the divider ratios of the input dividers formed by the resistors R1 and R2, as well as R3 and R4, respectively.

For a rising or higher input voltage, a current is fed through the emitter followers transistors T1 and T2 to a voltage divider formed of resistors R13 (6.8 kΩ), R14 (8.2 kΩ) and R15 (100 kΩ) through the emitter followers and the diodes D12 and D13 (both IN 4148) serving to increase the reverse voltage of these transistors.

The current proportional to this input voltage generates a potential at the base of a transistor T10 (BC 237) which, with sufficient magnitude, is suitable for making the transistor T10 conduct through a constant current source T15 (BC 237).

In order to save current, a voltage pulse is generated in the rhythm of the frequency of the oscillator C, coupled in through a coupling capacitor C4 (330 pF/100 V) and limited as far as the pulse amplitude is concerned by a Zener diode D4 (2.4 V). The voltage pulse acts on the base of the constant current source T15 in order to generate a pulsating current of constant magnitude there which in turn places the switched on light-emitting diodes LED3, LED 4 or LED5 (for instance for 12 V for the light-emitting diode LED 3) in rhythm through a respectively switched on transistor T10, T9 or T8 (all BC 237) (for instance, the transistor T10 for 12 V).

For a still higher input voltage, the voltage drop at the divider resistor R15 becomes so large that the transistor T9 is witched on, and through the differential amplifier effect between the transistor T9 and T10, the transistor T10 is switched off again, so that the light-emitting diode LED 4 is switched on.

The transistor T8 which, like the transistors T9 and T10 is a transistor of an indicating stage, is switched on through the resistor R14 in the same manner as already described if the input voltage is increased correspondingly.

The Zener diodes D1 and D2 of the bridge rectifier also serve for limiting the voltage.

Zener diodes D5 (5.1 V) and D6 (3.3 V) serve the purpose of not letting the voltage drop increase further with increasing input voltage if the threshold voltage at the base of the respectively corresponding transistor (T9, T10) is reached once, so that in this way the operating range of the transistors can be utilized, if possible, in the sense of a limited voltage supply for several indicating stages (in this case for the indicating stages with the transistors T8, T9 and T10).

The indicating stages for 12, 24 and 50 V are combined in an indicating chain E and are supplied with current by the battery B1.

The indicating stages for 110 V, 220 V, 380 V and 660 V are combined in a second indicating chain F.

This second indicating chain F with the indicating elements, namely the light-emitting diodes LED6 to LED9, is switched on for input voltages such as from 110 V and up, through a bridge rectifier formed by diodes D8 and D9 (both IN 4148) and the Zener diodes D1 and D2 and the threshold voltage formed by a Zener diode D3 (13 V). This works with increasing input voltage, for the indicating stages given according to the same step switching principle as is described for the indicating chain E.

The voltage divider of the indicating chain F is formed by divider resistors R16, R17, R18 and R19 (6.8, 2.4, 5.1 and 10 kΩ, respectively).

A Zener diode D7 (6.8 V) functions in a manner which corresponds to the functioning of the Zener diodes D5 and D6.

The capacitors C3, C5 (both 1 μF/35 V) and C6 (1.8 nF) are smoothing capacitors for the case of a-c voltage testing.

A resistor R20 (15 kΩ) is connected to the emitter of a constant current source T16 (BC 237) and to the base of a transistor T14 (BC 546).

A resistor R21 (7.5 kΩ) is connected in series with the base of the constant current source T16.

However, in the indicating chain F, the collectors of the transistors T11, T12, T13 and T14 (all BC 546) which are tied together, and the switched constant current source T16, are operated by the oscillator C of the signal generator and by its increased output amplitude which is above the level of the battery voltage. Specifically, this is done on one hand in order to keep the current small in this case by chopping, and on the other hand to obtain an increased voltage supply for driving the four indicating stages of this indicating chain.

The increased voltage is made possible by the inductance L belonging to the oscillator C and its mutual inductance. The oscillator C therefore does not only act together with the piezo-ceramic flexure oscillator 10 as an acoustical signal generator, but it also acts together with the inductance L as the chopper power supply A1 and as a chopper oscillator to save power in the battery operated equipment. Furthermore, the oscillator C which is coupled through a coupling capacitor C2 (3.3 μF/50 V), through a voltage doubler circuit including diodes D16 (IN 4148), D17 (IN 4148), D19 (16 V) and D20 (IN 4148), as well as through capacitors C7 and C8 (both 47 nF), acts on a capacitor C1 (22 μF/50 V) in the energy storage device A2. A voltage of about 40 to 50 V is developed therein by the voltage increase and doubling, if a 12 V battery is employed. When switching the switching element S2 from a break contact 14 to a make contact 15, the voltage available in the energy storage device can be switched through the diode D14 to the input of the isolation amplifier D.

Optionally, the resistor R12 which is framed in FIG. 4 by dotted lines, can be replaced by the divider circuit shown in FIG. 5, so that the voltage available in the energy storage device is connected to the input of the isolation amplifier D through a resistor R31 (100 kΩ) instead of through the resistor R12, and an isolation transistor T7 (BC 556) which is chopped through a coupling capacitor C9 (330 pF) by the oscillator C. An input voltage with increased time constant is produced which is chopped in the rhythm of the frequency of the oscillator C.

In both cases, an input voltage comes from the energy storage device. Since the input voltage is applied directly to the isolation amplifier, it simulates an input voltage which is higher than the voltage of the highest indicating stage to be tested that is present at the test prods. Through the discharge process initiated by means of the switching element S2, this simulated input voltage produces the effect of causing the test voltage to drop stepwise, starting with the highest indicating stage, so that each indicating stage is given a functional check as long as the funtional test switch of the switching element S2 is actuated, until the capacitor C1 is discharged. The acoustical signal generator likewise sounds in this test.

Resistors R22 (51Ω) and R23 (68Ω) are connected to the indicating chains E and F, respectively.

In the rest position, the switching element S1 is shunted by the Zener diode D18, so that the testing device is connected for testing a voltage.

When the switching element S1 is switched from the break contact 16 to make the contact 17, the battery B1 is switched on by a protective diode D15 (IN 4148). If a conductor is disposed between the test prods 4 and 5, the conductor can be checked for continuity.

If the test prods 4 and 5 are connected to each other, an internal test is made as described above. During this internal test, the energy storage device is also charged up.

A resistor R11 (150 kΩ) is shunted across the capacitor C1 by the switching element S2, so as to lower the discharge time constant.

For clarification, the circuit portion A is shown once more in FIG. 4; information is contained at the inputs and outputs of this circuit portion, as to the parts of the rest of the circuit to which they are connected.

The choice of the electrical components to be used in the circuit (inductance, resistors, capacitors, diodes, Zener diodes, transistors, light-emitting diodes) depends on the desired ranges for the indicating stages and presents no difficulty to a man of ordinary skill in this field if he is aware of the present invention.

The part of FIG. 6 which is framed by dotted lines and is provided with reference symbol 1, represents one of the two handles of the two-pole testing device. The other handle is designated with reference symbol 2, and is the handle in which the input resistor section RO and the entire circuit 18 of the testing device are contained. The test prod of the handle 1 is designated with reference symbol 4, and the test prod of the handle 2 is designated with reference symbol 5. The two handles 1 and 2 are connected to each other by a cable 3 which is provided with a shield 6.

Without adding the load resistance part into the circuit, the high-resistance series resistor RO, the overall circuit 18 of the testing device, in which all components for the optionally staggered indication of the voltage are contained, and the second high-resistance series resistor R30 which is contained in the handle 1 and represents the other resistance section of the high input resistance of the testing device, are connected in series.

If a voltage to be tested is applied to the test prods 4 and 5 and the key 27 is operated, at least one PTC (positive temperature coefficient) resistor 19 is shunted across the just described series circuit. A fixed resistor 23 which influences the time constant of the heating-up process is connected in series with the PTC resistor 19.

To further reduce the load resistance, further PTC resistors 20, 21 and 22 and further fixed resistors 24, 25 and 26 which are connected together in parallel, are connected in series therewith depending on the requirements.

In the diagram according to FIG. 7, the load current is shown as a function of the applied voltage and the time.

A curve X shown in FIG. 7 is obtained for an applied voltage of 380 V and shows that the time in which the PTC resistor is still effective is about 4 seconds in this embodiment example. In this case a current of 89 mA flows, i.e. a resistor of 4.2 kOhm resistance is switched on if the key 27 (FIG. 6) is operated for the duration of about 4 seconds, and therefore becomes effective. The resistance of 4.2 kOhm is obtained, for instance, by connecting three resistance combinations in parallel.

A curve Y applies if 220 V are present, and this curve shows that for the same connected resistance of 4.2 kOhm, the time of effectiveness is already 18 seconds.

A curve Z applies if 110 V of voltage are present. For this voltage and with 4.2 kOhm, the time of effectiveness is already more than 20 seconds.

Every voltage source has an internal resistance $R_I$, which is sometimes also called a source resistance $R_Q$. If voltages are tested in circuits, the knowledge of the internal resistance of the voltage source is of decisive importance for judging the measuring result. On the other hand, every measuring instrument has a certain input resistance $R_E$. The sum of the internal resistance $R_I$ and the input resistance $R_E$ determines the total current through the resulting measuring device, i.e. the ratio of the internal resistance to the input resistance unambiguously determines the voltage to be measured and can falsify it. Therefore, the input resistance $R_E$ of a voltmeter or a voltage testing device (checking device) should, in principle, be as high as technically possible. It is only with a very high input resistance $R_E$ of the testing device and a small internal resistance $R_I$ of the voltage source, that the indicated voltage corresponds to that of the voltage source. If the input resistance and the internal resistance are equal, the voltage $U_O$ to be tested is cut in half and only this half voltage is indicated.

A direct statement regarding the internal resistance of a voltage source is obtained if the input resistance of the test equipment is made smaller than the internal resistance of the voltage source. This is of advantage if one intends to test voltages which are coupled inductively and capacitively. In this manner, a statement is obtained as to whether a "true" voltage source with a small internal resistance is involved (constant voltage source) or whether the voltage source has a relatively high internal resistance.

This is utilized in the present invention, since if the voltage source has a high internal resistance, and an inductively and capacitively coupled voltage is involved, the voltage breaks down if the load resistance is added into the circuit.

In a testing device according to the invention, this test proceeds as follows

If the line voltage is being tested (220 V a-c voltage), all lightemitting diodes up to 220 V light. If a load resistor is connected in parallel by operating the key 27, so that the testing device becomes one of low-resistance, this indication is preserved if the line voltage is actually involved.

Therefore if, for instance, 220 V are indicated in the first test, and if the indicated voltage is reduced upon the operation of the key by adding the parallel-connected resistors, according to the magnitude of these resistors to 24 V, for instance, it follows that a voltage source with a high internal resistance is involved and therefore not the line voltage.

With the present invention a test can therefore also be performed, for instance, as to whether or not the other end of a long line is connected to voltage.

In the following listing, characteristic data for individual components are given.

LISTING OF THE REFERENCE SYMBOLS AND COMPONENTS USED, WITH INFORMATION CONCERNING THE VALUES (IN PARENTHESIS), AS A PREFERRED EMBODIMENT EXAMPLE

1 Handle with test prod 4 (test handle)
2 Handle with test prod 5 (indicator handle)
3 Cable
4 Test prod
5 Test prod
6 Shield
7 Slide protecion ring
8 Slide protection ring
9 Depression in the indicating handle 2

10 Piezo-ceramic flexure oscillator
11 Electrode
12 Electrode
13 Feedback electrode
14 Break contact of S2
15 Make contact of S2
16 Break contact of S1
17 Make contact of S1
18 Overall circuit in handle 2 which includes the circuit sections A to F
19 PTC resistor
20 PTC resistor
21 PTC resistor
22 PTC resistor
23 Fixed resistor
24 Fixed resistor
25 Fixed resistor
26 Fixed resistor
27 Push button key in handle 1

A Circuit portion
B Battery portion with switching on device
C Oscillator optionally equipped with an acoustical signal generator
D Isolation amplifier
E Indicating chain
F Indicating chain
G Housing for battery B1

A1 Switching power supply
A2 Energy storage device with switching element
A3 Circuit portion for continuity test and internal test
B1 Battery (12 V)
Bu Signal generator (buzzer)
C1 Capacitor in the energy storage device A2 (22 μF/50 V)
C2 Coupling capacitor (3.3 μF/50 V)
C3 Smoothing capacitor (1 μF/35 V)
C4 Coupling capacitor (330 pF/100 V)
C5 Smoothing capacitor (1 μF/35 V)
C6 Smoothing capacitor (1.8 nF)
C7 Coupling capacitor (47 nF)
C8 Coupling capacitor (47 nF)
C9 Coupling capacitor (selectable, see FIG. 5) (330 pF)
D1 Zener diode of the bridge rectifier (51 V)
D2 Zener diode of the bridge rectifier (51 V)
D3 Zener diode for forming a threshold voltage (13 V)
D4 Zener diode for limiting the pulse amplitude (2.4 V)
D5 Zener diode for limiting the voltage drop (5.1 V)
D6 Zener diode for limiting the voltage drop (3.3 V)
D7 Zener diode for limiting the voltage drop (6.8 V)
D8 Diode of the bridge rectifier (1N 4148)
D9 Diode of the bridge rectifier (1N 4148)
D10 Diode for reducing the divider ratio of R1/R2 (1N 4148)
D11 Diode for reducing the divider ratio of R3/R4 (1N 4148)
D12 Diode for increasing the cutoff voltage of T1 (1N 4148)
D13 Diode for increasing the cutoff voltage of T2 (1N 4148)
D14 Diode after S2/15 (1N 4148)
D15 Protective diode ahead of B1 (1N 4148)
D16 Diode for voltage doubling with D17, D19, D20 (for instance 1N 4148)
D17 Diode for voltage doubling with D16, D19, D20 (for instance 1N 4148)
D18 Zener diode of the circuit portion A3 (24 V)
D19 Zener diode for voltage doubling with D16, D19 D20 (16 V)
D20 Diode for voltage doubling wirh D16, D17, D19 (1N 4148)

L Inductance in the switching power supply A1 (100 mH)
LED1 Light-emitting diode for 6 V and negative polarity (for instance Siemens CQV 10-5/LD 30 II)
LED2 Light-emitting diode for 6 V and positive polarity (for instance Siemens CQV 10-5/LD 30 II)
LED3 Light-emitting diode for 12 V (for instance Siemens CQV 10-5/LD 30 II)
LED4 Light-emitting diode for 24 V (for instance Siemens CQV 10-5/LD 30 II)
LED5 Light-emitting diode for 50 V (for instance Siemens CQV 10-5/LD 30 II)
LED6 Light-emitting diode for 110 V (for instance Siemens CQV 10-5/LD 30 II)
LED7 Light-emitting diode for 220 V (for instance Siemens CQV 10-5/LD 30 II)
LED8 Light-emitting diode for 380 V (for instance Siemens CQV 10-5/LD 30 II)
LED9 Light-emitting diode for 660 V (for instance Siemens CQV 10-5/LD 30 II)

R0 High-resistance series resistor (330 kOhm)
R1 Input divider resistor (100 kOhm)
R2 Input divider resistor (180 kOhm)
R3 Input divider resistor (100 kOhm)
R4 Inout divider resistor (180 kOhm)
R5 Resistor in series with T3 (47 kOhm)
R6 Resistor in series with T4 (47 kOhm)
R7 Resistor in series with T6 (100 kOhm)
R8 Resistor in series with T6 (3.9 kOhm)
R9 Resistor in series with R10 of the oscillator C (150 kOhm)
R10 Resistor in series with T5 of the oscillator C (15 kOhm)
R11 Resistor (150 kOhm)
R12 Resistor (selectable, see FIG. 4) (5.6 kOhm)
R13 Divider resistor of the indicating stage 50 V (6.8 kOhm)
R14 Divider resistor of the indicating stage 24 V (8.2 kOhm)
R15 Divider resistor of the indicating stage 12 V (100 kOhm)
R16 Divider resistor of the indicating stage 660 V (6.8 kOhm)
R17 Divider resistor of the indicating stage 380 V (2.4 kOhm)
R18 Divider resistor of the indicating stage 220 V (5.1 kOhm)
R19 Divider resistor of the indicating stage 110 V (10 kOhm)
R20 Resistor between T14 and T16 (15 kOhm)
R21 Resistor in series with T16 (7.5 kOhm)
R22 Series resistor (51 Ohm)
R23 Series resistor (68 Ohm)
R30 High-resistance series resistor (330 kOhm)
R31 Resistor (selectable, see FIG. 5) (100 kOhm)

S1 Switching element
S2 Switching element
T1 Transistor of the emitter follower in the isolation amplifier (BC 237)
T2 Transistor of the emitter follower in the isolation amplifier (BC 237)

T3 Transistor for LED2 (BC 237)
T4 Transistor for LED1 (BC 237)
T5 Oscillator transistor (BC 546)
T6 Switching on transistor in the battery section B (BC 556)
T7 Disconnect transistor (selectable, see FIG. 5) (BC 556)
T8 Transistor of the indicating stage 50 V (BC 237)
T9 Transistor of the indicating stage 24 V (BC 237)
T10 Transistor of the indicating stage 12 V (BC 237)
T11 Transistor of the indicating state 660 V (BC 546)
T12 Transistor of the indicating stage 380 V (BC 546)
T13 Transistor of the indicating stage 220 V (BC 546)
T14 Transistor of the indicating stage 110 V (BC 546)
T15 Constant current source for E (BC 237)
T16 Constant current source for F (BC 237)

X Curve for 380 V
Y Curve for 220 V
Z Curve for 110 V

I claim:

1. Testing device for indicating an electric voltage and its polarity and for continuity testing, comprising:
a first and a second handle for accomodating circuits therein, a cable connected between said handles, first and second test prods each being respectively connected to one of said handles;
two high-resistance series resistors being connected in series with said test prods;
indicating stages having optical indicating elements with staggered voltage ranges disposed in one of said handles;
an oscillator connected to said indicating stages;
an acoustical signal generator being connected to and selectively drivable by said oscillator;
an isolation amplifier connected between said indicating stages and said high-resistance series resistors for amplifying input current being limited by said high-resistance series resistors;
a battery being connected to said isolation amplifier and being connectible into the testing device by said isolation amplifier to bring about a staggered indication of voltage to be tested, to selectively indicate polarity of the voltage to be tested and to switch on said acoustical signal generator;
a switching power supply being connected to and fed by said oscillator for increasing voltage of said oscillator limited by said battery;
an energy storage device connected to an input of said isolation amplifier for storing a charge and delivering it to said isolation amplifier;
a first switching element connected to said battery:
a second switching element being connected between said switching power supply and said energy storage device for feeding output voltage of said switching power supply to said energy storage device when said second switching element is in a rest position, said second switching element being in said rest position when said energy storage device is being charged and being switchable into a contact position for feeding a charge contained in said energy storage device to said input of said isolation amplifier and for automatically checking operability of indicating functions of the testing device in sequence;
transistors having bases connected to said oscillator for intermittently switching on or chopping indicating current for a first group of said optical indicating elements for a given relatively brief time for voltages to be tested in given relatively higher voltage ranges and for a second group of said optical indicating elements for voltages to be tested in given relatively lower voltage ranges;
a Zener diode connected between one of said high-resistance series resistors connected to said second test prod and said first switching element connected to said battery;
said first switching element being switchable into a rest position for shorting said Zener diode and into a contact position for switching on said battery; in said contact position of said first switching element the continuity test being performed through a conductor inserted between said test prods and an internal test being performed if direct contact is made between said test prods for operability of said battery, said acoustical signal generator, at least one of said optical indicating elements for the polarity indication, and at least one other of said optical indicating elements depending on voltage of said battery and charging of said energy storage device.

2. Testing device according to claim 1, wherein said energy storage device is a capacitor.

3. Testing device according to claim 1, wherein said isolation amplifier serves as an input stage and said two high-resistance series resistors are connected in series with said isolation amplifier, one of said series resistors being disposed in said first handle and the other of said series resistors being disposed in said second handle, said series resistors being connected together by said cable and said series resistors limiting current generated by voltage to be tested and fed to said isolation amplifier, and including a shield disposed on said cable;
said isolation amplifier including emitter follower transistors, input dividers connected to said emitter follower transistors, Zener diodes connected to said emitter follower transistors forming a bridge rectifier for causing said emitter follower transistors to conduct depending upon the connection of the polarity of the voltage to be tested through said bridge rectifier, additional transistors connected to said emitter follower transistors, two of said optical indicating elements being in the form of a light-emitting diode for indicating a positive input voltage and a light-emitting diode for indicating a negative input voltage both being connected to said additional transistors, and a further transistor being connected to said emitter follower transistors and having a base connected to said battery, one of said light-emitting diodes, and both of said light-emitting diodes in the case of an a-c voltage, being driven and simultaneously caused to conduct depending on the polarity of the voltage to be tested through said additional transistors, the base of said further transistor being given a potential difference relative to the positive potential of said battery and current for lighting said light-emitting diodes switched on by said further transistor being caused to flow by having said additional transistor in conduction;
said oscillator including an oscillator transistor, oscillator resistors connected to said oscillator transistor, and an inductor connected to said oscillator transistor and to said acoustical signal generator, said acoustical signal generator being in the form of a piezo-ceramic oscillator having three electrodes and being switched on by said oscillator transistor through said oscillator resistors;

said switching power supply being driven by said oscillator and including four power supply diodes connected to each other, three coupling capacitors connected to said power supply diodes, and said inductor;

said energy storage device including a storage capacitor, one of said power supply diodes for peak rectification, and said second switching element being connected between said storage capacitor and said one power supply diode for peak rectification in said rest position of said second switching element, voltage pulses from said switching power supply being stored in said storage capacitor by said one power supply diode for peak rectification for charging said storage capacitor to the peak value of the voltage pulses; and a protective diode and a current limiting resistor being connected between said second switching element and said input of said isolation amplifier.

4. Testing device according to claim 3, wherein said indicating stages for the staggered indication of individual voltage ranges are in the form of two indicating chains being separately supplied with indicating current, one of said indicating chains for the lower voltage ranges being supplied from said battery through said further transistor, the other of said indicating chains for higher voltage ranges being supplied by said switching power supply, and both of said indicating chains being intermittently switched on or chopped for saving current with the frequency of said oscillator.

5. Testing device according to claim 3 or 4, including an isolation transistor having a collector terminal and an emitter terminal one of said terminals being connected to said protective diode and the other of said terminals being connected to one terminal of said current limiting resistor and to said second switching element, and a base connected to the other terminal of said current limiting resistor, and a coupling capacitor having a pole connected to the base of said isolation transistor and to said other terminal of said current limiting resistor.

6. Testing device according to claim 1, including a circuit for temporarily lowering a high input resistance, having at least one PTC resistor shunted across the circuit accomodated in said second handle and across said two high-resistance series resistors forming the high input resistance, said at least one PTC resistor having a nominal resistance between 200Ω and 5 kΩ for ensuring a time constant of internal heating of at least one second.

7. Testing device according to claim 6, including at least one other resistor each having substantially fixed resistance values and being individually connected in series with each of said at least one PTC resistor.

8. Testing device according to claim 6 or 7, wherein the input resistors of said two high-resistance series resistors is substantially equal to 660 kΩ and said at least one PTC resistor has a nominal resistance value of substantially between 200Ω and 5 kΩ.

9. Testing device according to claim 8, wherein said at least one other resistor has a resistance value of substantially between 1 kΩ and 15 kΩ.

* * * * *